(12) United States Patent
Rao

(10) Patent No.: US 9,716,492 B1
(45) Date of Patent: Jul. 25, 2017

(54) METHOD AND CIRCUIT FOR DUTY CYCLE DETECTION

(71) Applicant: Invecas, Inc., Santa Clara, CA (US)

(72) Inventor: Venkata N. S. N. Rao, Fremont, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/241,664

(22) Filed: Aug. 19, 2016

(51) Int. Cl.
H03K 5/22 (2006.01)
H03K 5/156 (2006.01)
H03K 5/26 (2006.01)

(52) U.S. Cl.
CPC ............. *H03K 5/1565* (2013.01); *H03K 5/26* (2013.01)

(58) Field of Classification Search
None
See application file for complete search history.

(56) References Cited

U.S. PATENT DOCUMENTS

| | | | |
|---|---|---|---|
| 6,967,514 B2 * | 11/2005 | Kizer ................... | H03K 5/1565 327/175 |
| 2004/0135608 A1 * | 7/2004 | Pillay ................... | H03K 5/1565 327/175 |
| 2008/0290920 A1 * | 11/2008 | Cheng ................... | H03K 5/1565 327/175 |

* cited by examiner

*Primary Examiner* — Cassandra Cox
(74) *Attorney, Agent, or Firm* — Venture Pacific Law, PC

(57) ABSTRACT

A duty cycle detection circuit, comprises a charge storage component and compare logic. The charge storage component has at least one capacitor, at least one switch, and, at least one current source. A clock signal is used to operate the at least one switch for charging the at least one capacitor using the at least one current source. The charge storage component outputs a first signal indicative of an amount of charge stored when the clock signal is logic high and a second signal indicative of an amount of charge stored when the clock signal is logic low. The compare logic compares the first signal and the second signal to determine a duty cycle for the clock signal.

18 Claims, 4 Drawing Sheets

METHOD AND CIRCUIT FOR DUTY CYCLE DETECTION

FIELD OF INVENTION

The disclosure relates to duty cycle detection, and, more particularly, to a method and circuit for detecting the duty cycle of a clock signal.

BACKGROUND

Clock signals are commonly used in many electronics circuits for various purposes. For example, clock signals are used to trigger synchronous circuits (e.g., flip-flops) in digital circuits such as processors, memory devices, and so on. Clock signals may be generated with various types of oscillators and supporting circuitry.

A clock signal continually transitions between logic high and logic low. The clock signal has a duty cycle that is determined by the time duration at logic high and the time duration at logic low. It is desirable to generate the clock signal to have a duty cycle that is as close to 50% as possible, so that the logic high duration is close to the logic low duration. A digital circuit may use both the rising and falling edges of the clock signal to trigger synchronous circuits to achieve faster operating speed. A 50% duty cycle for the clock signal may then provide the synchronous circuits with maximum timing margins.

The duty cycle of a clock signal may be distorted due to various phenomena such as mismatches in transistor devices used to generate the clock signal. Great care is often used in designing clock generation and distribution circuits to minimize device mismatches. Unfortunately, as device size shrinks in advanced integrated circuit ("IC") process technologies, duty cycle distortion due to random variations and device mismatches becomes worse. Furthermore, digital circuits fabricated with advanced IC processes typically operate at high speed, e.g., one gigahertz ("GHz") or higher. The high speed corresponds to a smaller clock period, e.g., 1 nanosecond ("nsec") for 1 GHz. Small circuit mismatches may then translate to a relatively large error in duty cycle with the smaller clock period.

In order to correct for the error in the duty cycle, an IC typically has a detection circuit for precisely determining that error. Next, a duty cycle correction circuit can adjust the duty cycle to compensate for the error such that the duty cycle reaches the ideal 50 percent duty cycle or close to it as possible. Duty cycle detection can be performed in many ways. Some techniques involve converting high and low times to frequencies and then comparing the frequencies of the high and low times. This requires a complicated mechanism and long process times to improve the accuracy. Therefore, there exists a need for new techniques to efficiently and correctly determine a duty cycle of a clock signal.

SUMMARY OF INVENTION

Briefly, the disclosure relates to a duty cycle detection circuit, comprising: a charge storage component having at least one capacitor, at least one switch, and, at least one current source, wherein a clock signal is used to operate the at least one switch for charging the at least one capacitor using the at least one current source and wherein the charge storage component outputs a first signal indicative of an amount of charge stored when the clock signal is logic high and a second signal indicative of an amount of charge stored when the clock signal is logic low; and compare logic for comparing the first signal and the second signal to determine a duty cycle for the clock signal.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the present disclosure may be practiced.

Generally, a duty cycle detection circuit of the present disclosure comprises: a charge storage component having at least one capacitor, at least one switch, and, at least one current source. A clock signal is used to operate the at least one switch for charging the at least one capacitor using the at least one current source. The charge storage component outputs a first signal indicative of an amount of charge stored when the clock signal is logic high and a second signal indicative of an amount of charge stored when the clock signal is logic low (e.g., when an inverse signal Clk_B of the clock signal is logic high). The compare logic compares the first signal and the second signal to determine a duty cycle for the clock signal. The duty cycle detection circuit can optionally include other components, for instance, a latching component and/or a reset component. To aid in the understanding of the invention, one or more of the optional components can be included in the various embodiment of the present disclosure.

Figure 1:
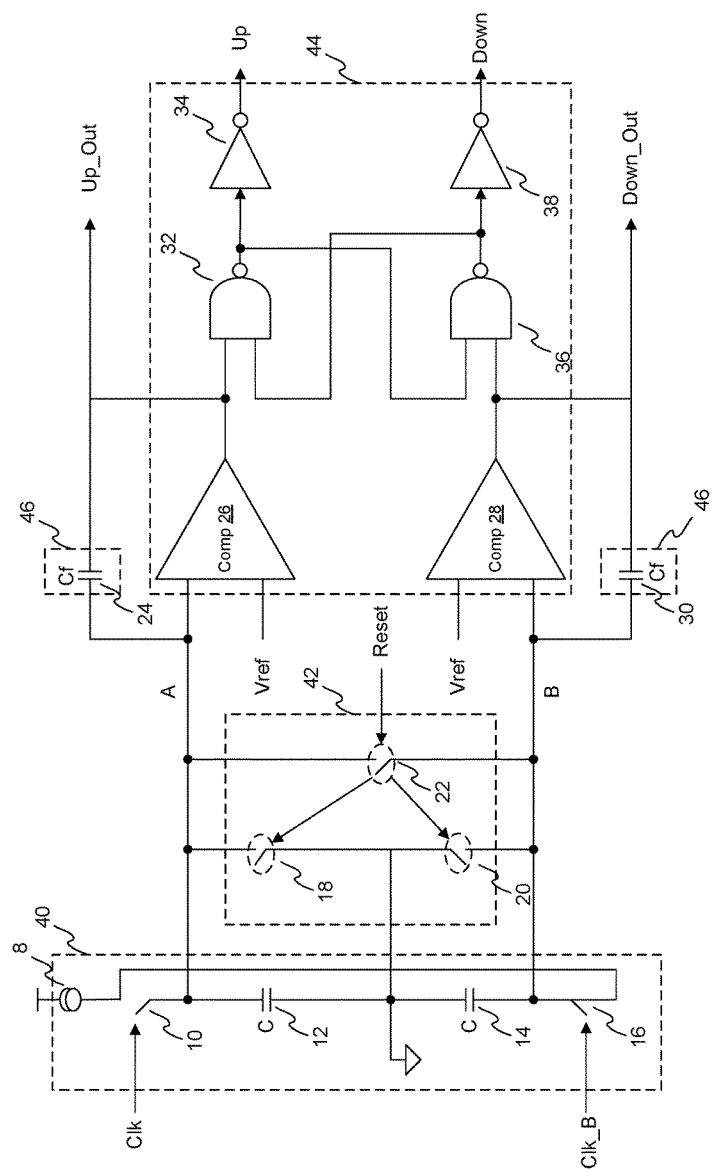
FIG. 1 illustrates a duty cycle detection circuit of the present disclosure.

FIG. 1 illustrates a duty cycle detection circuit of the present disclosure. The duty cycle detection circuit can detect the duty cycle for a clock signal Clk. The duty cycle detection circuit of the present disclosure comprises a charge storage component 40, a reset component 42, a compare logic 44, and a latching component 46.

The charge storage component 40 comprises a current source 8, capacitors 12 and 14, and switches 10 and 16. The switch 10 and the capacitor 12 are serially connected in a first branch. The switch 16 and the second capacitor 14 are serially connected in a second branch. The first branch and the second branch are connected across the current source 8 and ground.

When the clock signal Clk is logic high, the switch 10 is closed. When the switch 10 is closed, the current source 8 charges the capacitor 12 for providing a signal A. The signal A indicates an amount of charge stored when the clock signal is logic high. Likewise, when an inverse signal of the clock signal Clk_B is logic high (i.e., when the clock signal is logic low), the switch 16 is closed. When the switch 16 is closed, the current source 8 charges the second capacitor 14 for providing a signal B. The signal B indicates an amount of charge stored when the clock signal is logic low. Thus, only one of the capacitors 12 and 14 are charged at a time since when the switch 10 is opened, the switch 16 is closed, and vice versa.

The compare logic 44 comprises comparators 26 and 28, NAND gates 32 and 36, and inverters 34 and 38. The comparator 26, the NAND gate 32, and the inverter 34 are serially connected to compare the signal A (indicative of the logic-high amount of charge) to a reference voltage Vref. The reference voltage Vref can be determined as a function of a comparator common mode voltage range.

Based on this comparison, an Up signal is generated. Likewise, the comparator 28, the NAND gate 36, and the second inverter 38 are serially connected to compare the signal B (indicative of the logic-low amount of charge) to the reference voltage Vref. Based on this comparison, a Down signal is generated.

The signal A and the reference voltage Vref are inputted to the comparator 26. The comparator 26 determines if the signal A is at or exceeds the reference voltage Vref. If so, a logic high output is generated by the comparator 26. If not, a logic low output is generated by the comparator 26. The output of the comparator 26 is inputted to the NAND gate 32. An output of the NAND gate 36 is connected to another input of the NAND gate 32. An output of the NAND gate 32 is inputted to the inverter 34. The inverter 34 inverts the NAND gate 32's output, and generates the Up signal for output. The Up signal indicates whether the clock signal has a high pulse greater than a low pulse.

The signal B and the reference voltage Vref are inputted to the comparator 28. The comparator 28 determines if the signal B is at or exceeds the reference voltage. If so, a logic high output is generated by the comparator 28. If not, a logic low output is generated by the comparator 28. The output of the comparator 28 is inputted to the NAND gate 36. The output of the NAND gate 32 is connected to another input of the NAND gate 36. The output of the NAND gate 36 is inputted to the inverter 38. The inverter 38 inverts the NAND gates 36's output, and generates the Down signal for output. The Down signal indicates whether the clock signal has a duty cycle less than fifty percent.

The latching component 46 comprises capacitors 24 and 30. The capacitor 24 can be used for latching the output of the comparator 26 to its input that receives the signal A. A first end of the latching capacitor 24 is coupled to the input of the comparator 26 with the signal A and a second end of the latching capacitor 24 is coupled to the output of the comparator 26. The capacitor 24 can provide a positive feedback latch such that the comparator 26 is insensitive to fluctuations in the signal A. Furthermore, the value at the comparator 26's output can provide an Up_Out signal. The time duration between a reset signal for initializing the duty cycle detection circuit and an edge transition for the Up_Out signal can indicate the duty cycle for the clock signal.

A first end of the latching capacitor 30 is coupled to the input of the comparator 28 with the signal B and a second end of the latching capacitor 30 is coupled to the output of the comparator 28. The capacitor 30 can also provide a positive feedback latch such that the comparator 28 is insensitive to fluctuations in the signal B. Furthermore, the value at the comparator 28's output can provide a Down_Out signal. The time duration between a reset signal for initializing the duty cycle detection circuit and an edge transition for the Down_Out signal can indicate the duty cycle for the clock signal.

The reset component 42 comprises switches 18, 20, and 22 for initializing the capacitors 12 and 14 to ground and for resetting the compare logic 44 to an initial state. The reset signal operates the switch 18, 20, and 22. The purpose of the switches 18, 20, and 22 are to reset the capacitors 12 and 14 to ground. The switch 22 can be used to reduce the offset between capacitors 12 and 14. When the reset signal is logic high, the switches 18, 20, and 22 are closed. When the reset signal is logic low, the switches 18, 20, and 22 are opened.

In terms of overall operation, the Up and Down signals indicate whether the duration of the logic high portion of the clock signal Clk is higher or the duration of the logic low portion of the clock signal CLK is higher. Furthermore, measuring the Up_Out signal and Down_Out signal from the reset can provide the duty cycle, respectively.

Figure 2:
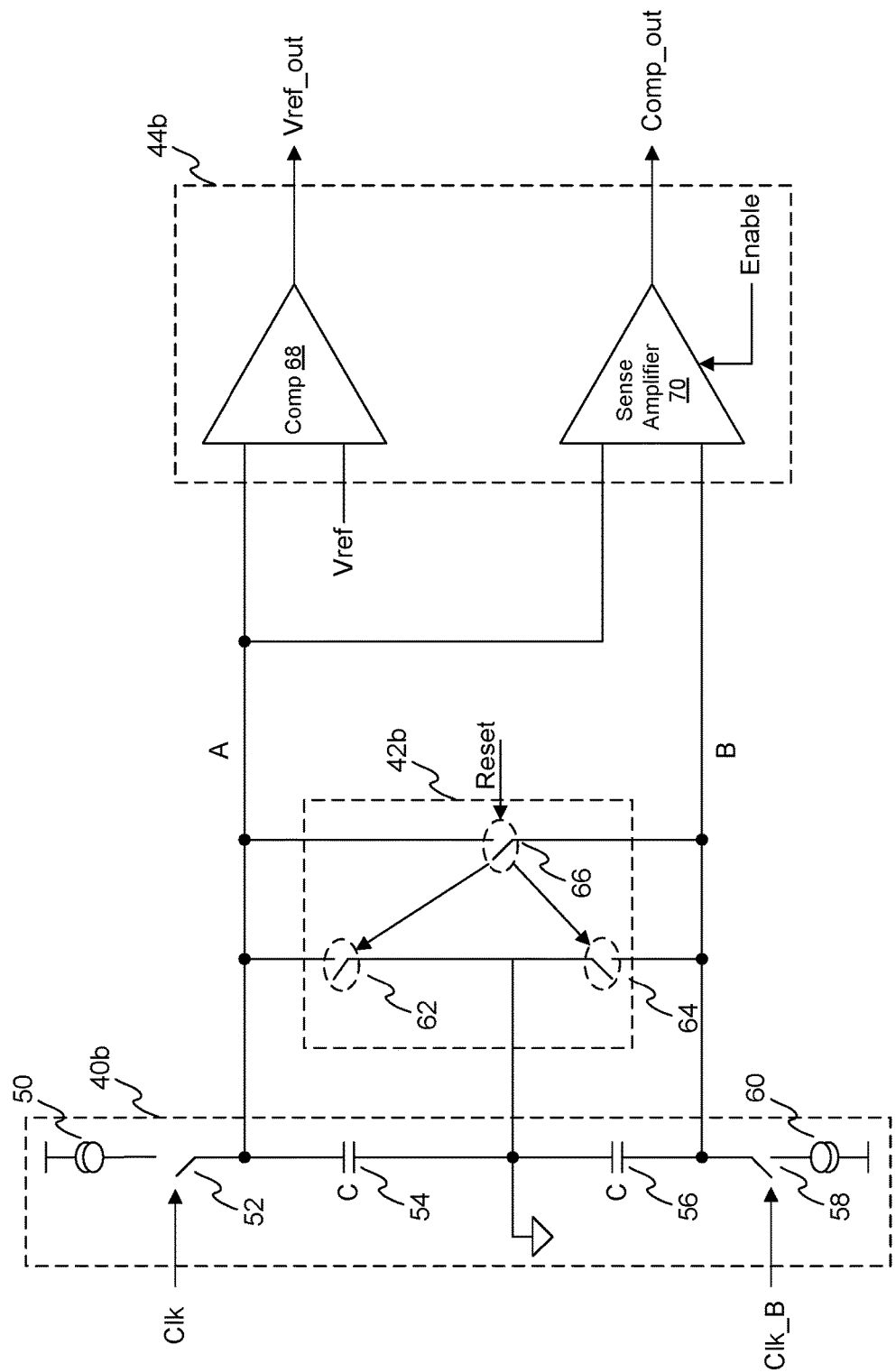
FIG. 2 illustrates another embodiment of a duty cycle detection circuit of the present disclosure.

FIG. 2 illustrates another embodiment of a duty cycle detection circuit of the present disclosure. In another embodiment, the implementation for the charge storage component and the compare logic can be altered. In particular, the duty cycle detection circuit of the present disclosure comprises a charge storage component 40b, a reset component 42b, and a compare logic 44b.

The charge storage component 40b comprises current sources 50 and 60, capacitors 54 and 56, and switches 52 and 58. The current source 50, the switch 52, and the capacitor 54 are serially connected. The current source 60, the switch 58, and the capacitor 56 are also serially connected. In this embodiment, two current sources 50 and 60 can be used to prevent charge leakage from the capacitors 12 and 14.

When the clock signal Clk is logic high, the switch 52 is closed. When the switch 52 is closed, the current source 50 charges the capacitor 54 for providing a signal A. The signal A indicates an amount of charge stored when the clock signal is logic high. Likewise, when an inverse signal Clk_B of the clock signal is logic high (i.e., when the clock signal Clk is logic low), the switch 58 is closed. When the switch 58 is closed, the current source 60 charges the capacitor 56 for providing a signal B. The signal B indicates an amount of charge stored when the clock signal is logic low.

The compare logic 44b comprises a comparator 68 and a sense amplifier 70. The signal A is inputted to the comparator 68 and to an input of the sense amplifier 70. The reference voltage Vref is connected to another input of the comparator 68. The signal B is connected to another input of the sense amplifier 70. The comparator 68 compares the signal A to the reference voltage, and generates a voltage Vref_out to indicate that determination. When the voltage Vref_out is a logic low, then the reference voltage Vref is greater than the signal A. When the voltage Vref_out is logic high, then the reference voltage Vref is equal to or less than the signal A. The sense amplifier determines the difference between the signal A and the signal B, and then generates the signal Comp_out to indicate that determination.

When the signal A is greater than the signal Verf, the signal Vref_out becomes logic high. High on Vref_out enables the sense amplifier 70, which in turn compares signals A and B. If signal A is greater than signal B, then the comparator's output Comp_out goes to a logic high value. A logic high value for Comp_out is indicative of a high duty cycle and low is indicative of a low duty cycle. When the signal B is greater than signal A and signal A is greater than Vref, then the signals Vref_out and Comp_out will reflect such cases by both being logic high. The sense amplifier 70 can be used to determine the voltage difference between the signal A and the signal B. This voltage difference can be translated to the duty cycle of the clock signal since the voltage potentials of the signals A and B are directly related to charging of the capacitors 54 and 56 during the duty cycle of the clock signal Clk and the inverse of the clock signal Clk_B. An enable signal can be inputted to the sense amplifier 70 to enable and disable the sense amplifier functionality.

When the signal A is greater than signal B and signal A is greater than Vref, then the signal Vref_out will be a logic high and the signal Comp_Out will be a logic low. The sense amplifier 70 can be used to determine the voltage difference between the signal A and the signal B. This voltage difference can be translated to the duty cycle of the clock signal since the voltage potentials of the signals A and B are directly related to charging of the capacitors 54 and 56 during the duty cycle of the clock signal Clk and the inverse the clock signal Clk_B.

The reset component 42b comprises switches 66, 62, and 64 for initializing the capacitors 54 and 56 to ground and for resetting the compare logic 44b to an initial state. The reset signal operates the switches 62, 64, and 66. When the reset signal is logic high, then the switches 62, 64, and 66 are closed. When the reset signal is logic low, then the switches 62, 64, and 66 are opened.

In terms of overall operation, the comparator 68 can be used for common mode adjustment and the sense amplifier 70 used for sensing. A time T required to charge the caps to Vref can be equal to T=2*C*Vref/I, where C is the capacitance of each of the capacitors 54 and 56 and I is the current from each of the current sources 50 and 60. For instance, if C=0.5 pf, Vref=0.65V, I=30 uA, then T=21.6 n. Thus, a voltage difference between the signal A and the signal B when there is 1% difference in duty cycles is 25 mV. Due to process mismatches, two similar capacitors and current sources won't offer the same capacitance and current. To average the mismatch, clock signals CLK and CLKB can be switched at the inputs to the duty cycle detection circuit. For instance, a case where clock signals CLK and CLKB have 50% duty cycles, a capacitance C offset and a current I offset may result in 20 mv which translates to a variation of 5% duty cycle. In this case, the clock signal CLK to capacitor 12 results in a logic high value determination on Comp_out, whereas by switching clock polarity will result in a logic low value determination on Comp_out.

Figure 3:
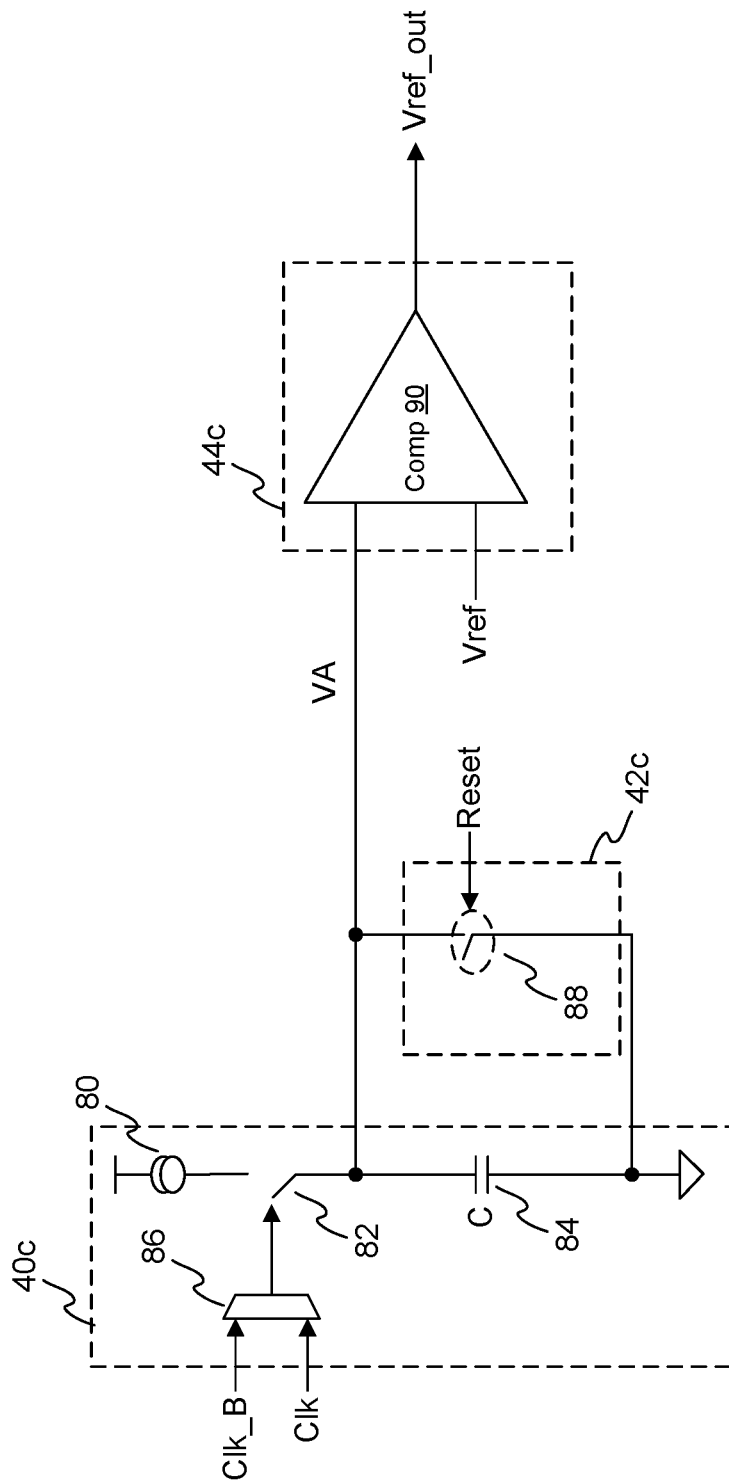
FIG. 3 illustrates yet another embodiment of a duty cycle detection circuit of the present disclosure.

FIG. 3 illustrates yet another embodiment of a duty cycle detection circuit of the present disclosure. In yet another embodiment, a duty cycle detection circuit comprises a charge storage component 40c, a reset component 42c, and a compare logic 44c. The charge storage component 40c comprises a current source 80, a switch 82, a capacitor 84, and a multiplexer 86. A clock signal Clk and an inverse of the clock signal Clk_B are inputted to the multiplexer 86. An output of the multiplexer 86 controls the switch 82. When the output of the multiplexer 86 is logic high, then the switch 82 is closed. When the output of the multiplexer 86 is logic low, then the switch 82 is opened. When the switch 82 is closed, the current source 80 charges the capacitor 84 for providing an output signal VA.

The multiplexer 86 can be operated to select one of the input clocks signals for determining if the charging of that selected clock signal is greater than the reference voltage Vref. For instance, if the multiplexer 86 selects the clock signal Clk until VA is greater than Vref or Vref_out is high, a time $T_{high}$ is found between when the reset occurred and when vref_out is high. The inputs to the multiplexer can be selected to change from CLK to CLK_B and repeat the process again to find $T_{low}$. A duty cycle for the clock signal can be found by $T_{high}/(T_{high}+T_{Low})$. The compare logic 44c comprises a comparator 90. The signal VA is inputted to the comparator 90. Another input of the comparator 90 is connected to the voltage reference Vref. The comparator 90 compares the signal VA and Vref, and outputs that determination as Vref_out.

The reset component 88 comprises a switch 88, which is operated by a reset signal. The reset signal can be used to close the switch 88 such that the duty cycle detection circuit is initialized. In particular, the signal VA is coupled to ground when the switch 88 is closed. During operation to detect the duty cycle, the switch 88 is opened so the signal VA is no longer tied to ground.

In terms of overall operation, a time T required to charge the capacitors to Vref is T=2*C*Vref/I, where C is the capacitance of the capacitor 84 and I is the current from the current source 80. For C=0.5 pf, Vref=0.65, I=30 uA, the time to charge is T=21.6 nS. A time T1 at which VA>Vref is determined. The multiplexer 86 can be selected to switch its output from the clock signal CLK to the inverse clock signal CLKB. A time T2 is found at which VA>Vref. If the time T1 is greater than the time T2, a high cycle of the clock signal is smaller than a low cycle of the clock signal and vice versa if T2 is greater than T1.

Figure 4:
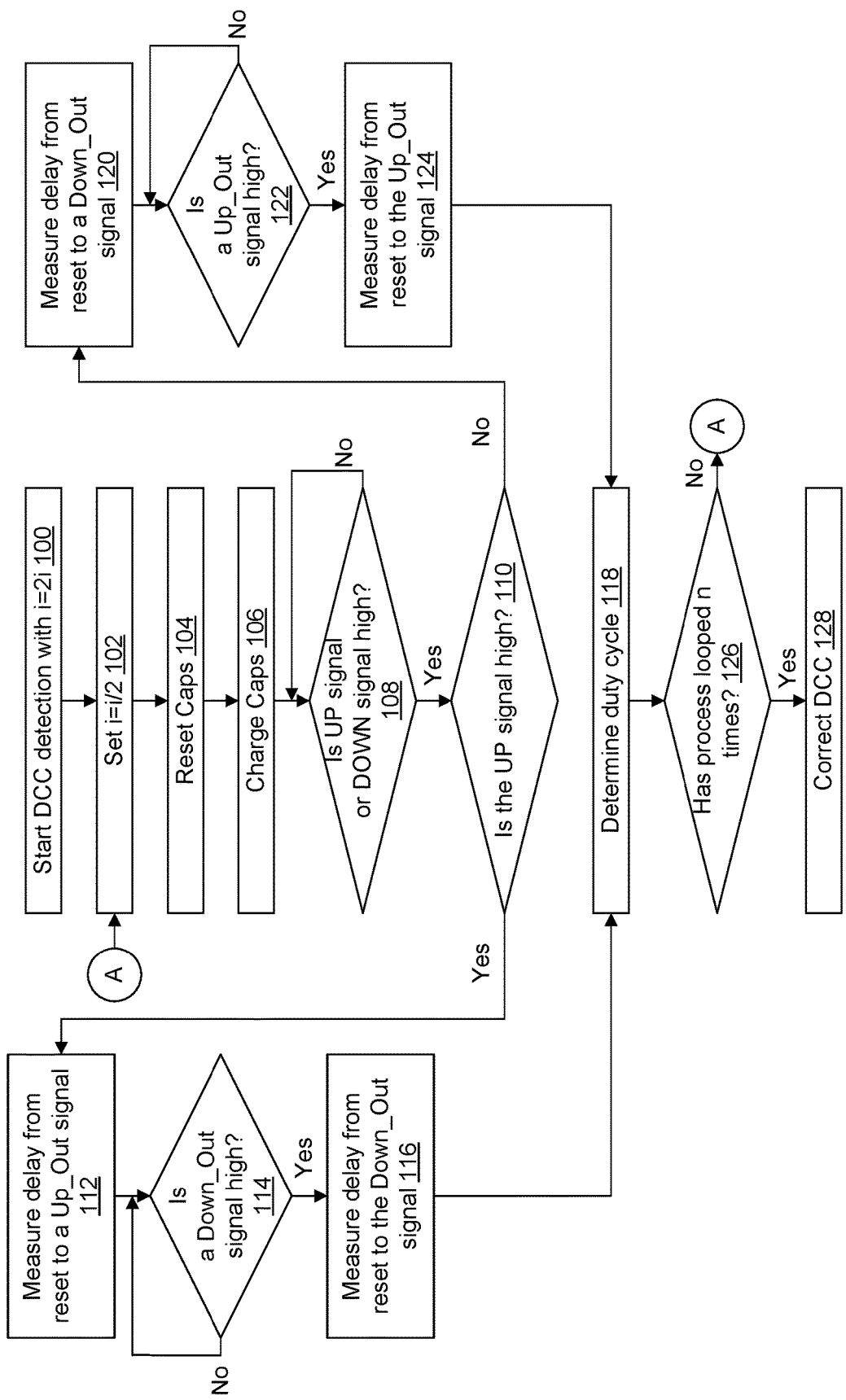
FIG. 4 illustrates a flow chart for operating a duty cycle detection circuit of the present disclosure.

FIG. 4 illustrates a flow chart for operating a duty cycle detection circuit of the present disclosure. A duty cycle detection circuit, e.g., the duty cycle detection circuit illustrated in FIG. 1, can be operated using a process flow of the present disclosure. The duty cycle detection circuit ("DCC") can be initialized for detection by setting the current of the current source 8 to twice an initial value i, step 100. The current source value can be reset to a new value by halving the previous value, step 102. In this embodiment, two separate steps are performed, but it is understood that other initializations can be performed such that step 100 and step 102 are combined or are slightly altered to be substantially similar in operation to the present disclosure. For instance, the steps 100 and 102 can be combined such that the current source can be set to an initial value i for use in a first run through the steps, and then halved (or divided by another factor) in each subsequent iteration through the steps.

The capacitors 12 and 14 of the DCC can be reset to ground by the reset component, step 104. As previously mentioned, a reset signal can be used to activate (i.e., close) the switch(es) of the reset component. When the switch(es) 18-22 of the reset component 42 are closed, the various components such as the compare logic 44 and the charge storage component 40 are reset back to an initial state (e.g., the charge storage component is grounded). Once reset, the clock signal Clk and the inverse clock signal Clk_B can be used to operate the switches 10 and 16 within the charge storage component 40 to start charging the capacitors 12 and 14, step 106.

A determination is made of whether the Up signal or the Down signal is logic high, step 108. If neither are logic high, then the determination can be repeated until a true case is found. In alternative embodiments, a waiting period can be applied before repeating the determination in step 108. If so, a next determination is made to determine whether the Up signal is logic high (or, alternatively in another embodiment, the Down signal is logic high), step 110.

If the Up signal is high, then an up-time delay can be measured, step 112, from when the reset signal was initialized in step 104 until the Up_Out signal has an edge transition. Next, it is determined whether a Down_Out signal is logic high, step 114. If not, the determination can be repeated until this case is true. In alternative embodiments, a waiting period can be applied before repeating the determination in step 114. If so, a down-time delay is measured from the reset signal in step 104 to when the Down_Out signal has an edge transition, step 116. The duty cycle can be determined, step 118, by the up-time delay divided by the period.

Likewise, if the Down signal is high (i.e., in step 110, the Up signal is logic low), then a down-time delay can be measured, step 120, from when the reset signal was initialized in step 104 until the Down_Out signal has an edge transition. Next, it is determined whether an Up_Out signal is logic high, step 122. If not, the determination can be repeated until this case is true. In alternative embodiments, a waiting period can be applied before repeating the determination in step 122. If so, an up-time delay is measured from the reset signal in step 104 to the Up_Out signal has an edge transition, step 124. The duty cycle can be determined, step 118, by the up-time delay divided by its period.

It is determined whether the process has iteratively looped a predefined amount n of times, step 126. If not, the process starts again at step 102 by halving the current for the current source. The change in current can provide for a different resolution of monitoring it. Once the process has looped n times, a DCC can be used to correct the problem using the data determined by the process, step 128. As the number of n increases, the resolution of the duty cycle detection circuit increases as well since the charging increments for the capacitors are increasingly smaller with a greater number of iterations. For instance, it is known that the change in voltage or the change in time can be represented as $dV/dT=I/C$ or simply that $dV/dT$ is proportional to I. As the current is decreased, more time is needed to get to the necessary voltage compared to Vref; thereby having more resolution.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

I claim:

1. A duty cycle detection circuit, comprising:
   a charge storage component having at least one current source, a first capacitor, a second capacitor, a first switch, and a second switch,
   wherein the first switch and the first capacitor are serially connected in a first branch,
   wherein the second switch and the second capacitor are serially connected in a second branch,
   wherein the first branch and second branch are connected across the at least one current source and ground,
   wherein the first switch is operable by a clock signal, and
   wherein the second switch is operable by an inverse of the clock signal;
   and
   compare logic for comparing a first signal indicative of an amount of charge stored by the first capacitor to a reference voltage and for comparing a second signal indicative of an amount of charge stored by the second capacitor to the reference voltage, where the comparisons are used to determine a duty cycle for the clock signal.

2. The duty cycle detection circuit of claim 1 wherein the compare logic comprises a first comparator, a second comparator, a first NAND gate, and second NAND gate, a first inverter, and a second inverter, wherein the first comparator, the first NAND gate, and the first inverter are serially connected to compare the logic-high amount of charge to a reference voltage, and wherein the second comparator, the second NAND gate, and the second inverter are serially connected to compare the logic-low amount of charge to the reference voltage.

3. The duty cycle detection circuit of claim 2 wherein the first signal and the reference voltage are coupled to the inputs of the first comparator, wherein an output of the first comparator is coupled to a first input of the first NAND gate, wherein an output of the second NAND gate is coupled to a second input of the first NAND gate, wherein an output of the first NAND gate is coupled to the input of the first inverter, and wherein the first inverter outputs a Up signal indicating whether the clock signal has a duty cycle greater than fifty percent.

4. The duty cycle detection circuit of claim 3 further comprises a latching capacitor, wherein a first end of the latching capacitor is coupled to the first signal and wherein a second end of the latching capacitor is coupled to the output of the first comparator.

5. The duty cycle detection circuit of claim 2 wherein the second signal and the reference voltage are coupled to the inputs of the second comparator, wherein an output of the second comparator is coupled to a first input of the second NAND gate, wherein the output of the first NAND gate is coupled to a second input of the second NAND gate, wherein an output of the second NAND gate is coupled to the input of the second inverter, and wherein the second inverter outputs a Down signal indicating whether the clock signal has a duty cycle less than fifty percent.

6. The duty cycle detection circuit of claim 5 further comprises a latching capacitor, wherein a first end of the latching capacitor is coupled to the second signal and wherein a second end of the latching capacitor is coupled to the output of the second comparator.

7. The duty cycle detection of claim 1 wherein the first switch is closed when the clock signal is logic high, wherein when the first switch is closed, the current source charges the first capacitor for providing the first signal, wherein the second switch is closed when an inverse of the clock signal is logic high, and wherein when the second switch is closed, the current source charges the second capacitor for providing the second signal.

8. The duty cycle detection circuit of claim 1 further comprising a reset component, wherein the reset component comprises one or more switches for initializing the first capacitor to ground and the second capacitor to ground and for resetting the compare logic to an initial state.

9. The duty cycle detection circuit of claim 1 further comprising a reset component, wherein the reset component comprises one or more switches for initializing the at least one capacitor to ground and for resetting the compare logic to an initial state.

10. The duty cycle detection circuit of claim 1 wherein the compare logic comprises a comparator and a sense amplifier, wherein the first signal is coupled to a first input of the comparator and to a first input of the sense amplifier, wherein a reference voltage is coupled to a second input of the comparator, and wherein the second signal is coupled to the second input of the sense amplifier.

11. The duty cycle detection circuit of claim 10 wherein the at least one current source comprises a first current source and a second current source, wherein first current source, the first switch, and the first capacitor are serially connected, and wherein the second current source, the second switch, and the second capacitor are serially connected.

12. The duty cycle detection of claim 11 wherein the first switch is closed when the clock signal is logic high, wherein when the first switch is closed, the first current source charges the first capacitor for providing the first signal, wherein the second switch is closed when an inverse of the clock signal is logic high, and wherein when the second switch is closed, the second current source charges the second capacitor for providing the second signal.

13. The duty cycle detection circuit of claim 11 further comprising a reset component, wherein the reset component comprises one or more switches for initializing the first capacitor to ground and the second capacitor to ground and for resetting the compare logic to an initial state.

14. A duty cycle detection circuit, comprising:
a charge storage component having a current source, a first capacitor, a second capacitor, a first switch, and a second switch,
wherein the first switch and the first capacitor are serially connected in a first branch,
wherein the second switch and the second capacitor are serially connected in a second branch,
wherein the first branch and second branch are connected across the current source and ground,
wherein the first switch is closed when a clock signal is logic high,
wherein, when the first switch is closed, the current source charges the first capacitor for providing a first signal indicative of an amount of charge stored when the clock signal is logic high,
wherein the second switch is closed when an inverse of the clock signal is logic high,
wherein, when the second switch is closed, the current source charges the second capacitor for providing a second signal a second signal indicative of an amount of charge stored when the clock signal is logic low; and
compare logic for comparing the first signal and the second signal to determine a duty cycle for the clock signal,
wherein the compare logic comprises a first comparator, a second comparator, a first NAND gate, and second NAND gate, a first inverter, and a second inverter,
wherein the first comparator, the first NAND gate, and the first inverter are serially connected to compare the logic-high amount of charge to a reference voltage,
wherein the second comparator, the second NAND gate, and the second inverter are serially connected to compare the logic-low amount of charge to the reference voltage,
wherein the first signal and the reference voltage are coupled to the inputs of the first comparator,
wherein an output of the first comparator is coupled to a first input of the first NAND gate,
wherein an output of the second NAND gate is coupled to a second input of the first NAND gate,
wherein an output of the first NAND gate is coupled to the input of the first inverter,
wherein the first inverter outputs a Up signal indicating whether the clock signal has a duty cycle greater than fifty percent,
wherein the second signal and the reference voltage are coupled to the inputs of the second comparator,
wherein an output of the second comparator is coupled to a first input of the second NAND gate,
wherein the output of the first NAND gate is coupled to a second input of the second NAND gate,
wherein an output of the second NAND gate is coupled to the input of the second inverter, and
wherein the second inverter outputs a Down signal indicating whether the clock signal has a duty cycle less than fifty percent.

15. The duty cycle detection circuit of claim 14 further comprises a first latching capacitor and a second latching capacitor, wherein a first end of the first latching capacitor is coupled to the first signal, wherein a second end of the first latching capacitor is coupled to the output of the first comparator, wherein a first end of the second latching capacitor is coupled to the second signal and wherein a second end of the second latching capacitor is coupled to the output of the second comparator.

16. The duty cycle detection circuit of claim 14 further comprising a reset component, wherein the reset component comprises one or more switches for initializing the first capacitor to ground and the second capacitor to ground and for resetting the compare logic to an initial state.

17. A duty cycle detection circuit, comprising:
a charge storage component having a capacitor, a switch, a current source, and a multiplexer,
wherein the multiplexer has inputs for a clock signal and an inverse of the clock signal,
wherein the current source, the switch and the capacitor are serially connected, and
wherein the switch is operable by an output of the multiplexer; and
compare logic for determining a first amount of time a first signal takes to exceed a reference voltage when the switch is coupled to the inverse of the clock signal and for determining a second amount of time a second signal takes to exceed the reference voltage when the switch is coupled to the clock signal,
wherein the duty cycle is determinable by comparing the first amount of time and the second amount of time.

18. The duty cycle detection circuit of claim 17 wherein the compare logic comprises a comparator, wherein inputs of the comparator are coupled to a connection between the capacitor and the switch and to the reference voltage.

* * * * *